United States Patent
Delacruz et al.

(10) Patent No.: US 11,270,979 B2
(45) Date of Patent: *Mar. 8, 2022

(54) SYMBIOTIC NETWORK ON LAYERS

(71) Applicant: Invensas Corporation, San Jose, CA (US)

(72) Inventors: Javier A. Delacruz, San Jose, CA (US); Belgacem Haba, Saratoga, CA (US); Rajesh Katkar, Milpitas, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/842,199

(22) Filed: Apr. 7, 2020

(65) Prior Publication Data

US 2020/0387471 A1 Dec. 10, 2020

Related U.S. Application Data

(60) Provisional application No. 62/857,578, filed on Jun. 5, 2019.

(51) Int. Cl.
*H01L 25/065* (2006.01)
*G06F 15/78* (2006.01)
(Continued)

(52) U.S. Cl.
CPC ...... *H01L 25/0657* (2013.01); *G06F 15/7825* (2013.01); *H01L 23/53204* (2013.01);
(Continued)

(58) Field of Classification Search
CPC .......... G06F 15/7825; G06F 2015/763; H01L 25/0657
See application file for complete search history.

(56) References Cited

U.S. PATENT DOCUMENTS 6,781,407 B2 * 8/2004 Schultz ............... G06F 15/7867
326/38
7,500,060 B1 * 3/2009 Anderson ............... G06F 7/785
711/132
(Continued)

FOREIGN PATENT DOCUMENTS

| CN | 107908985 A | 4/2018 |
| JP | 2011135433 A | 7/2011 |
| KR | 100839593 B1 | 6/2008 |

OTHER PUBLICATIONS

International Search Repot including Written Opinion for Application No. PCT/US2020/034547 dated Sep. 15, 2020, 10 pages.
(Continued)

*Primary Examiner* — Jason Crawford
(74) *Attorney, Agent, or Firm* — Lerner, David, Littenberg, Krumholz & Mentlik, LLP

(57) ABSTRACT

The technology relates to a system on chip (SoC). The SoC may include a plurality of network layers which may assist electrical communications either horizontally or vertically among components from different device layers. In one embodiment, a system on chip (SoC) includes a plurality of network layers, each network layer including one or more routers, and more than one device layers, each of the plurality of network layers respectively bonded to one of the device layers. In another embodiment, a method for forming a system on chip (SoC) includes forming a plurality of network layers in an interconnect, wherein each network layer is bonded to an active surface of a respective device layer in a plurality of device layer.

21 Claims, 14 Drawing Sheets

(51) Int. Cl.
  *H01L 25/18* (2006.01)
  *H01L 23/00* (2006.01)
  *H01L 23/532* (2006.01)
  *G06F 15/76* (2006.01)

(52) U.S. Cl.
  CPC .............. *H01L 24/08* (2013.01); *H01L 24/83* (2013.01); *H01L 25/18* (2013.01); *G06F 2015/763* (2013.01); *H01L 2224/08145* (2013.01); *H01L 2225/06524* (2013.01); *H01L 2924/1433* (2013.01); *H01L 2924/1434* (2013.01)

(56) References Cited

U.S. PATENT DOCUMENTS

| | | | |
|---|---|---|---|
| 8,042,082 B2 | 10/2011 | Solomon | |
| 10,243,882 B1 | 3/2019 | Swarbrick et al. | |
| 10,410,694 B1* | 9/2019 | Arbel | G06F 11/1044 |
| 10,503,690 B2* | 12/2019 | Swarbrick | G06F 15/7807 |
| 10,672,744 B2 | 6/2020 | Teig et al. | |
| 10,700,094 B2 | 6/2020 | Delacruz et al. | |
| 10,832,912 B2 | 11/2020 | Delacruz et al. | |
| 2006/0056411 A1 | 3/2006 | Badat et al. | |
| 2008/0082621 A1 | 4/2008 | Han et al. | |
| 2008/0237591 A1 | 10/2008 | Leedy | |
| 2009/0070721 A1* | 3/2009 | Solomon | H01L 27/11807 716/118 |
| 2009/0245257 A1 | 10/2009 | Comparan et al. | |
| 2011/0158247 A1 | 6/2011 | Toyoshima | |
| 2014/0177626 A1* | 6/2014 | Thottethodi | H01L 23/481 370/351 |
| 2014/0376557 A1* | 12/2014 | Park | H04L 49/101 370/400 |
| 2015/0072520 A1 | 3/2015 | Li et al. | |
| 2015/0103822 A1* | 4/2015 | Gianchandani | G06F 15/7825 370/389 |
| 2015/0130534 A1 | 5/2015 | Droege et al. | |
| 2017/0171111 A1 | 6/2017 | Khare et al. | |
| 2018/0074572 A1* | 3/2018 | Bauman | G06F 15/7825 |
| 2019/0123023 A1* | 4/2019 | Teig | H01L 25/0657 |
| 2019/0363717 A1* | 11/2019 | Swarbrick | G06F 21/76 |
| 2020/0387471 A1 | 12/2020 | Delacruz et al. | |
| 2020/0388592 A1* | 12/2020 | Delacruz | G06F 15/7825 |

OTHER PUBLICATIONS

International Search Report including Written Opinion for Application No. PCT/US2020/034565 dated Aug. 31, 2020, 10 pages.

* cited by examiner

SYMBIOTIC NETWORK ON LAYERS

CROSS-REFERENCE TO RELATED APPLICATION

The present application claims the benefit of the filing date of U.S. Provisional Patent Application No. 62/857,578 filed Jun. 5, 2019, the disclosure of which is hereby incorporated herein by reference.

BACKGROUND

A system on chip (SoC) is an integrated circuit that generally includes components of a computer or other such electrical system on a single substrate in a single housing. The components within a SoC may include any combination of processors, memory, controllers, power management, network controllers, and other such computer components. By integrating these components onto a single substrate in a single housing of a SoC, the amount of space taken up by the components may be reduced relative to if the components were implemented discretely.

Communication between the components of the SoC, as well as communication between components of the SoC and off-package components, such as memory not located in the SoC housing, is controlled through the use of communication subsystems. Communication subsystems may route data between the components of the SoC via one or more computer buses and/or crossbars. As the number of components within a SoC increases, the number of buses and crossbars increases. In some instances, the length of the buses and crossbars may also increase. The increase in the number of buses and crossbars, as well as the length of the buses and crossbars may lead to communication delays and increased power usage by the SoC.

In SoCs having a three-dimensional (3D) packaging structure, such as a SoC having multiple layers, with components of a computer or other such electrical system on substrates in each layer, the 3D footprint of the components may further limit the possible communication paths between and on the layers. In this regard, the number of possible paths available to communications subsystems between layers may be limited to locations where components are not overlapping on adjacent stacked layers. Accordingly, the length of the communication paths between components located on different layers may be increased, which may lead to communication delays and increased power usage by the SoC. Moreover, a larger component positioned on one layer may block a portion of a substrate of another layer, thereby requiring the communication subsystem of the second layer to route around the component.

Some SoCs have implemented network-on-chip (NoC) communication subsystems. In a NoC communication subsystem, networking interfaces, each associated with a component of the SoC, packetize data to be passed to other components. The networking interfaces communicate with a set of interconnected routers which direct the packetized data to its intended destination component. A networking interface at the destination component may de-packetize the data and pass the de-packetized data into the destination component.

A NoC communication subsystem may decrease communication delays typically encountered in bus and crossbar communication subsystems by directing the packetized data through a more direct communication path to its destination component. However, NoC communication subsystems may still suffer from delays caused by inefficient communication paths resulting from the limited amount of real estate on the substrate caused by the density of components on the substrate in the SoC. In this regard, the NoC communication subsystem may need to be routed around components, thereby increasing the length of the communication paths.

Processors generally use NoC communication subsystems to retrieve date from cache memory located off of the processor die, such as L2 or L3 cache memory. Given the limited space around a processor die, the size of L2 cache memory may be limited. As such, the processor may need to rely on typically slower L3 cache memory that is located further from the processor die or off-package cache memory, such L4 cache memory which is typically located outside of a SoC. The use of a NoC communication subsystem may provide more efficient read and write operations to L3 and L4 cache than previously possible with buses and crossbar communication subsystems. However, due to the distance data needs to travel to and from the processor to L3 and L4 cache memory, the processor may be required to delay processing as it waits for data from the L3 and L4 cache memory.

SUMMARY

Aspects of the disclosure provide a system on chip (SoC). The SoC may include a plurality of network layers and a device layer. The plurality of network layers may include a first network layer and a second network layer. Each network layer may include one or more routers. The first device layer may include one or more components. The first device layer may have an active surface and a second opposite surface. The active surface may be bonded to the second network layer and the second opposite surface may be bonded to the first network layer.

In some examples, the first network layer and the second network layer are configured to route data to and from the one or more components on the first device layer. In some instances, at least one of the one or more components includes a network interface, wherein the network interface connects the at least one component to the first network layer and the second network layer via conductive structures. In some instances, the conductive structures comprise one or more of traces, vias, contacts, or terminals. In some instances, the network interface is configured to packetize and depacketize the data.

In some examples, the first device layer comprises at least one of an application specific integrated circuit (ASIC) layer or a memory layer.

In some examples, the plurality of network layers each comprise an active surface having one or more contacts; and a second surface opposite the active surface having one or more contacts. In some instances, the second surface of the second network layer is bonded to the active surface of the first device layer and the active surface of the first network layer is bonded to the second surface of the first device layer.

In some examples, the SoC includes a memory layer including an active surface having one or more contacts, the active surface of memory layer being bonded to the active surface of the second network layer. In some instances, the memory layer includes one or more memory segments, each of the one or more memory segments being connected to at least one of the one or more routers in the second network layer via one or more conductive structures. In some instances, the second network layer is configured to route data between the one or more components in the first device layer and the one or more memory segments. In some examples, the bonds between the first device layer and first and second network layers, and the bonds between the memory layer and the second network layer are formed via ZiBond direct bonding and/or direct bond interconnect (DBI) hybrid bonding.

In some instances, the SoC includes a second device layer including one or more components, the second device layer having an active surface and a second opposite surface, the second opposite surface being bonded to the active surface of the second network layer.

In some instances, the SoC includes a third device layer including one or more components, the third device layer having an active surface and a second opposite surface, the active surface being bonded to the second surface of the first network layer. In some examples, the first and second network layers are configured to route data between the one or more components on the third device layer and the one or more components in the second device layer.

In some instances, the bonds between the first device layer and first and second network layers, the bonds between the second device layer and the second network layer, and the bonds between the third device layer and the first network layer are formed via ZiBond direct bonding and/or direct bond interconnect (DBI) hybrid bonding.

In some examples, the one or more components include one or more of processors, graphics processing units (GPUs), logic boards, digital sound processors (DSP), or network adaptors. In some instances, the first and second network layers are configured to ignore faulty memory segments or faulty processors.

In some examples, the one or more routers of the first and second network layer are connected via one or more routing traces in each respective network layer.

In some instances, the first and second network layers are connected to memory located outside of the SoC.

DETAILED DESCRIPTION

The technology relates to a system on chip (SoC) having one or more network layers. Conventional SoCs utilize communication subsystems, such as NoCs to enable communication between components in the SoC. However, due to the limited availability of space on the substrate of the SoC, the ability to efficiently route the communication subsystems may be impeded, potentially leading to reduced speed of data communication between components and, in some instances, resulting in processing bottlenecks. As described herein, the communication subsystem may be moved to one or more network layers, located above, below, or adjacent to device layers, such as application specific integrated circuit (ASIC) layers and memory layers. By doing such, more efficient routing of the communication subsystem may achieved as the routing of the communication subsystem may not be obstructed or otherwise limited by components on the device layers. As a result, the distance data travels during communication may be reduced and the routing of the data to its destination may be more direct.

In some instances, a memory layer may be positioned above, below, or adjacent a network layer to provide increased memory availability to processors or other components on the ASIC layer. The memory on the memory layer may operate as L2 cache memory. As a result of the larger amount of L2 cache memory on the SoC, the number of requests for data from memory that is located further from the processor die, such as L3 cache memory or off-package memory, such as L4 cache memory, may be significantly reduced, thereby limiting or removing the need for off-package data requests and allowing for increased frequency of operation.

Figure 1:
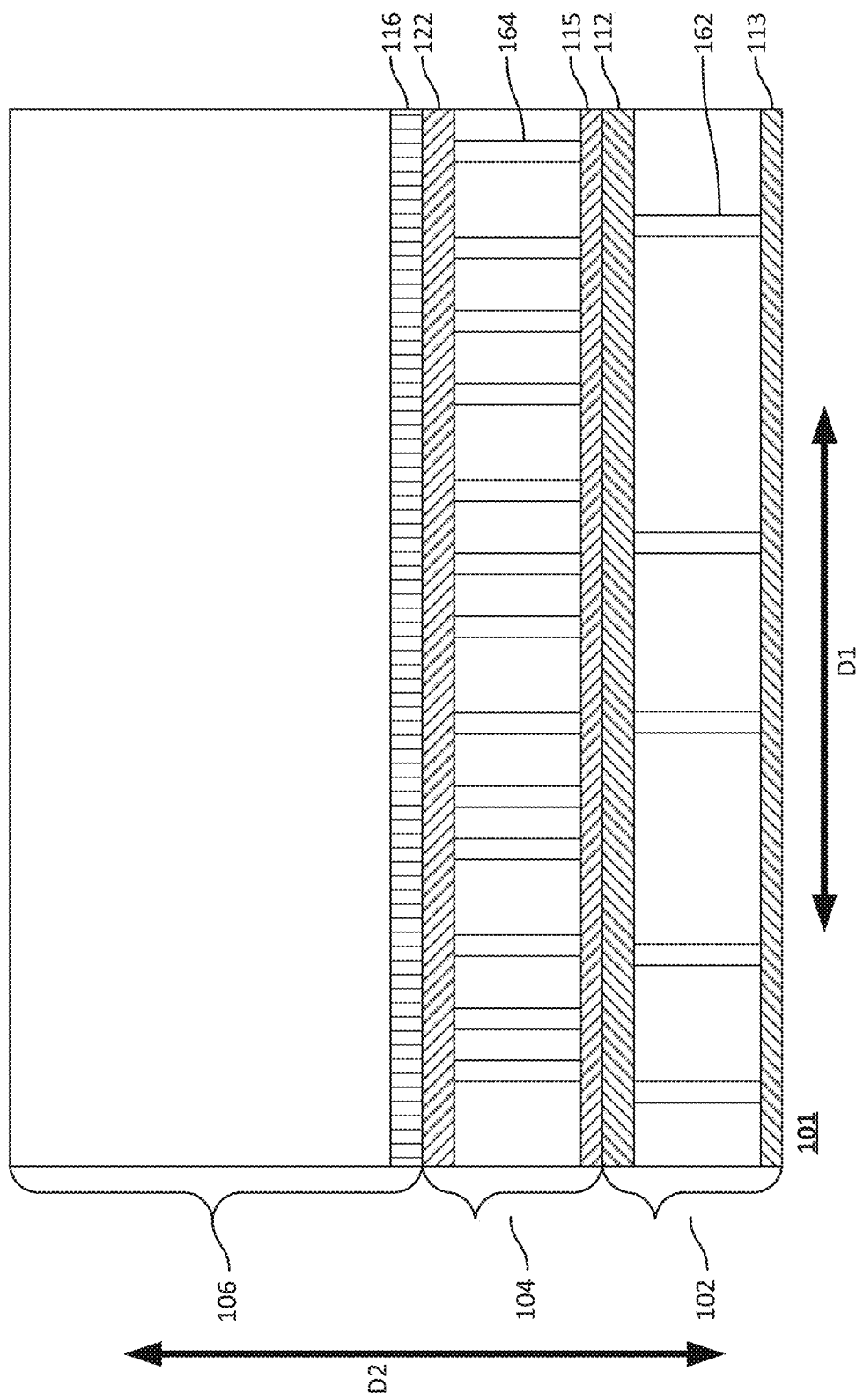
FIG. 1 is a side, cross-section view of a SoC including three layers in accordance with aspects of the disclosure.

FIG. 1 illustrates, a system on chip 101 comprised of two device layers and a network layer. The SoC 101 includes a first device layer, such as an application specific integrated circuit (ASIC) layer 102, a network layer 104, and a second device layer, such as a memory layer 106. The exemplary structure shown in the system on chip 101 only depicts one network layer 104 formed between the ASIC layer 102 and the memory layer 104 for ease of explanation of the operation of the network layer 104. It is noted that additional network layers may be formed among many devices layer in the system on chip 101 as needed, which is described in greater detail herein.

The network layer 104 may have an active surface 122 and a second surface 115 opposite the active surface 122. The active surface 122 of the network layer 104 may be bonded to an active surface 116 of the memory layer 106. The second surface 115 of the network layer 104 may be bonded to an active surface 112 of the ASIC layer 102. Although not shown, a second surface 113 of the ASIC layer 102 may include or connect with other electrical components, is described in detail herein.

As used in this disclosure with reference to the ASIC layer 102, the network layer 104, the memory layer 106, or another layer having a planar surface, a statement that an electrically conductive structure, such as contacts, terminals, etc. is "at" or "on" a surface of a layer indicates that, when the respective layer is not assembled with any other element, the electrically conductive structure is available for contact with a theoretical point moving in a direction perpendicular to the surface of the layer toward the surface of the layer from outside the layer. Thus, a terminal or other conductive structure which is at a surface of a layer may project from such surface; may be flush with such surface; or may be recessed relative to such surface in a hole or depression in the respective layer. In some embodiments, the conductive structure may be attached to the surface or may be disposed in one or more layers of coating on the said surface.

Figure 2:
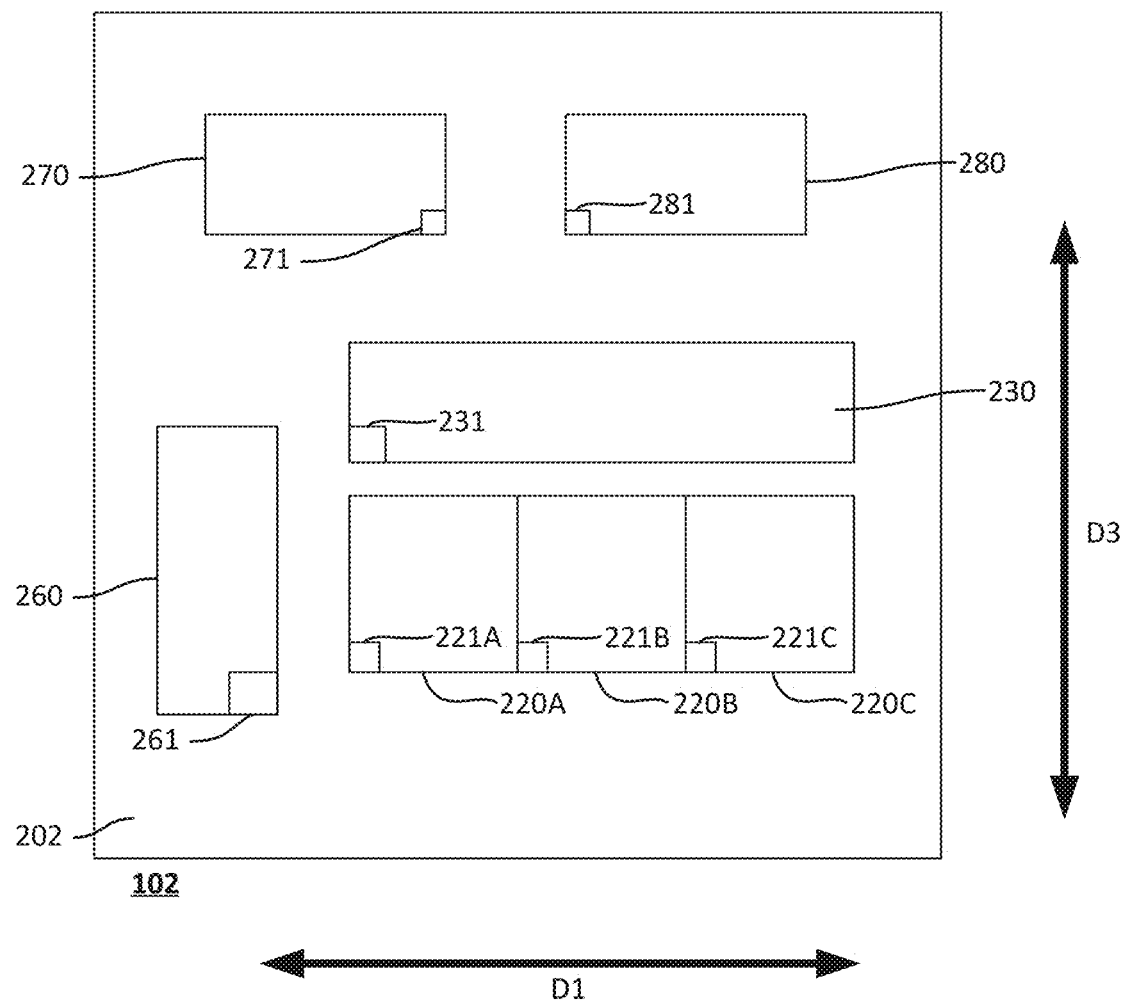
FIG. 2 is a top-down view of an application specific integrated circuit (ASIC) layer in accordance with aspects of the disclosure.

In FIG. 1, the first direction D1 is referred to herein as "horizontal" or "lateral" direction, which may be considered an x-axis), whereas the directions perpendicular to the SoC 101, illustrated by second direction D2 is referred to herein as upward or downward direction and are also referred to herein as the "vertical" direction or a z-axis. FIG. 2 illustrates a third direction D3 that is perpendicular to direction D1. Direction D3 may also be considered a "horizontal" or "lateral" direction or a y-axis. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

FIG. 2 shows a top down view of the ASIC layer 102 with the active surface 112 removed for clarity. The ASIC layer 102 includes a substrate 202 and components mounted, fabricated or otherwise positioned on the substrate 202. The components include processors 220A-220C, graphics processing unit (GPU) 230, logic board 260, digital sound processor (DSP) 270, and network adaptor 280. The ASIC layer 102 may include any combination of components typically found in an ASIC device or other such computing devices. The components shown mounted on the substrate 202 are for illustration purposes only. More than one ASIC layer or other types of the device layers may be included on a SoC.

The term "component," as used herein, may refer to one or more functional blocks. Functional blocks may be singular or complex circuits built in or on a layer to perform certain electrical functions. The components may be interconnected internally or externally together to form numerous microcircuits, larger circuits, or any suitable types of integrated circuits. The components and functional blocks as described herein are applicable to any types or numbers of electrical structures and/or elements as needed.

Each component in the ASIC layer 102 may include a network interface that enables the component to communicate over the network in the network layer 104, described herein. FIG. 2 shows network interfaces including network interfaces 221A-221C in processors 220A-220, network interface 231 in GPU 230, network interface 261 in logic board 260, network interface 271 in DSP 270, and network interface 281 in network adaptor 280. Although the network interfaces in FIG. 2 are illustrated as being within respective components, the network interfaces may be located adjacent to their respective components.

The substrate 202 of the ASIC layer 102 may be constructed from one or more semiconductor materials, such as materials including at least one of crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI) (e.g., buried dielectric layer disposed on a silicon crystalline substrate), carbon doped silicon oxides, silicon nitride, doped silicon, germanium, gallium arsenide, glass and sapphire. In some embodiments, the substrate 202 (or any of the substrates disclosed herein) may be made from a material such as semiconductor material, ceramic, glass, liquid crystal polymer material, a composite material such as glass-epoxy or a fiber-reinforced composite, a laminate structure, or a combination thereof.

The vertical distance between device layers and/or between device layer and network layers can be as small as microns when the layers are bonded face-to-face (e.g., active surface to active surface, active surface to second surface, or second surface to second surface, as described herein). The vertical distance from the base of a layer through the layer to an adjacent face-to-face bonded layer, such that the distance includes the thickness of the layer, may be 5 μm-55 μm, although the distances may be less or more depending on the thickness of the substrates and layers. The lateral distance across a layer may be several millimeters. In this situation, additional circuitry such as repeaters, inverters and/or buffers may be needed to maintain the signal integrity needed to travel across that electrical load over that longer distance. For example, if a there is a multi-processor device, the distance needed between a given processor to a shared memory or a crossbar may be a few millimeters due to the need to traverse the width of another processor.

Figure 5:
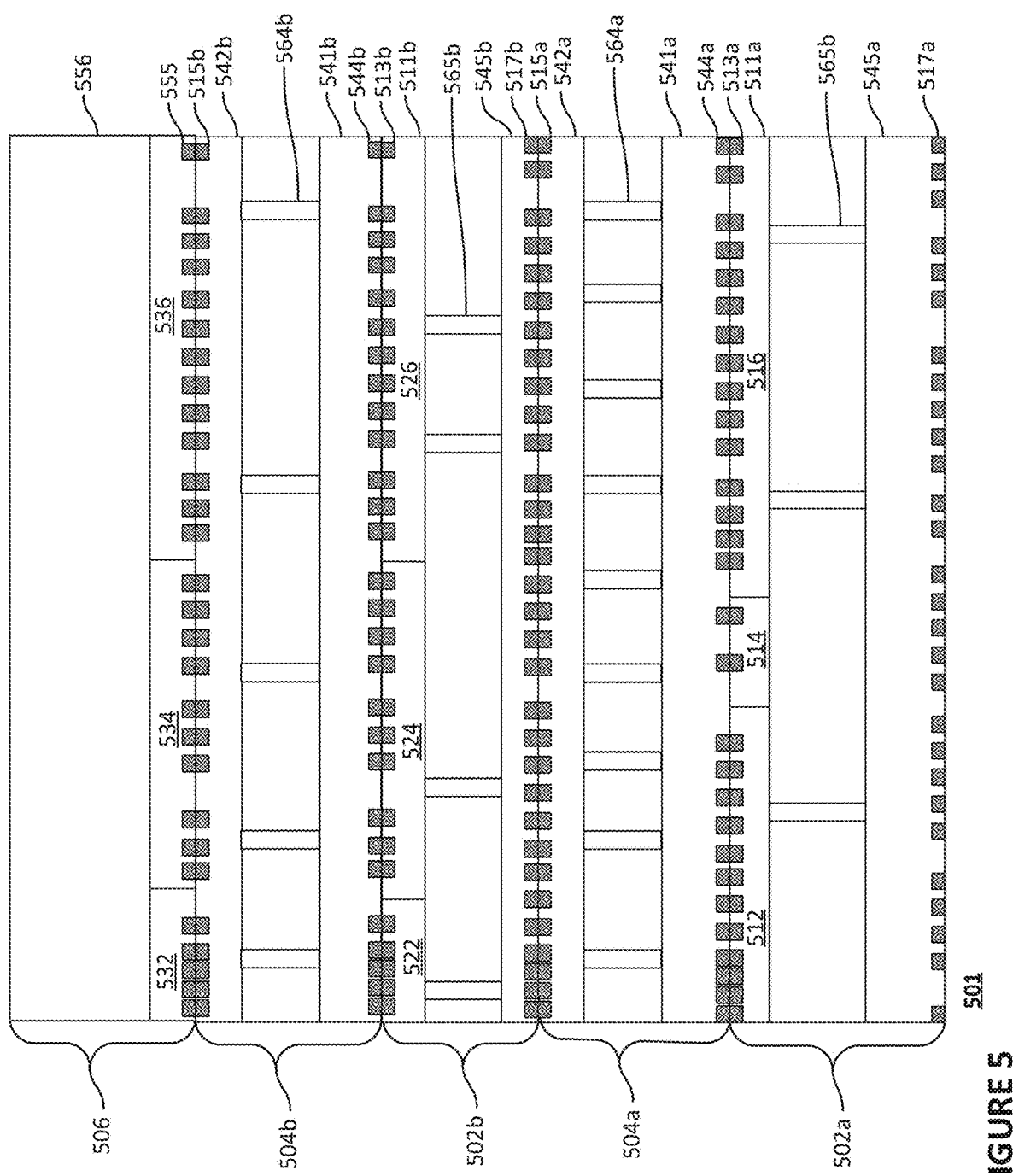
FIG. 5 is a cross-section, side view of the interconnections of multiple device layers in accordance with aspects of the disclosure.

Referring to FIG. 1, the active surface 112 and the second surface 113 of the ASIC layer 102 may be configured to provide electrical interconnections between the ASIC layer 102 and other layers in the SoC 101 or other components external to the SoC 101. For instance, and as shown in the enlarged, side view of the ASIC layer 102 in FIG. 3, the second surface 113 may include conductive structures including terminals 303 on its lower surface 301. The terminals 303 may be configured to form electrical connections between components in the ASIC layer 102, network layer 104, and/or memory layer 106, with one or more components external to the SoC 101, such as a printed circuit board (PCB), power supply, etc. For clarity, components such as processors 220A-220C, GPU 230, etc., are not shown in the ASIC layer 102 of FIG. 3. One exemplary embodiment of where the components may be located in the ASIC layer 102 is illustrated in FIG. 5, which will be further described herein. The terminals 303 may be arranged according to a surface-mount packaging type, such as a ball grid array (BGA), pin grid array (PGA), or land grid array (LGA). In some instances, there may be around 1,000 terminals at the lower surface 301 of the second surface 113.

Figure 3:
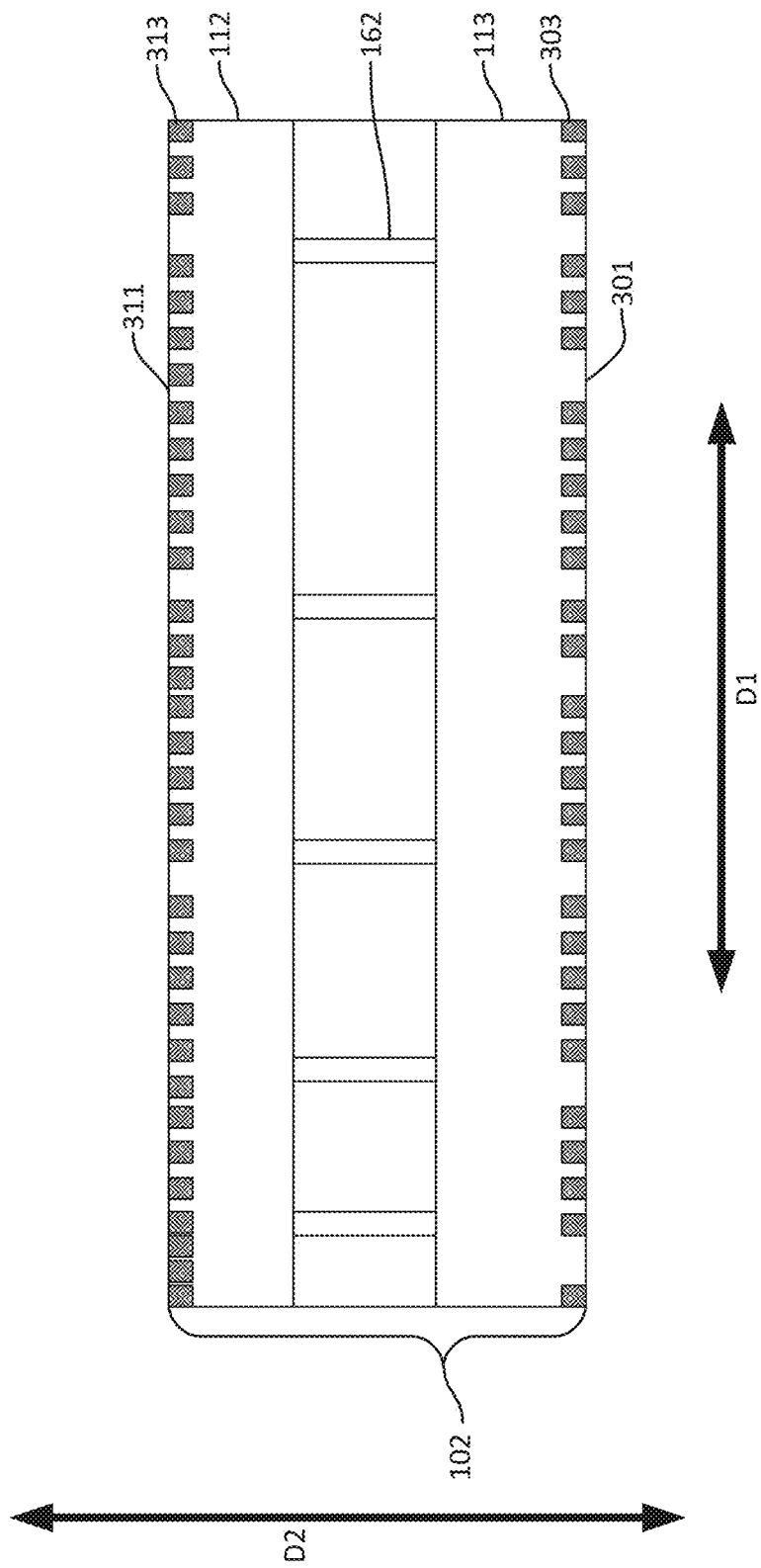
FIG. 3 is a side, cross-section view of an ASIC layer in accordance with aspects of the disclosure.

As further illustrated in FIG. 3, the active surface 112 of the ASIC layer 102 may include conductive structures including contacts 313 on its upper surface 311. The contacts 313 may be configured to align with corresponding contacts 314 on the network layer 104 (as shown in FIG. 5) to form electrical connections between the network layer 104 and the ASIC layer 102.

Although not illustrated, the ASIC layer 102, including active surface 112 and second surface 113, may include conductive structures configured to connect components in the ASIC layer 102 (e.g., processors 220A-220C, GPU 230, etc.,) through their respective network interfaces (e.g., 221A-221C, 231, etc.,) with the network layer 104, other components in the ASIC layer 102, and/or the terminals 303. Such conductive structures may include traces extending in the horizontal direct D1 along the lower and upper surfaces 301, 311 of the second surface and active surface 112, respectively. The traces may also extend in the direction perpendicular to D1 along the lower and upper surfaces 301, 311, illustrated as direction D3 in FIG. 2. In some instances, the traces may be contained within the ASIC layer 102. In some examples, components in the ASIC layer 102 may directly connect with terminals 303 and/or with other components without the use of network interfaces.

The conductive structures may also include conductive interconnects such as vias 162 (e.g., through silicon vias (TSVs), through oxide vias (TOVs) or through-glass vias (TGVs)) extending in the vertical direction D2 between the active surface 112 and the second surface 113, as further shown in FIG. 3. In some instances, the conductive interconnects may extend in the horizontal directions D1 and/or vertical direction D2 within or on the substrate 202. The conductive interconnects and vias 162 may terminate at a contact or terminal, such as terminals 303 and contacts 313. Although FIG. 3 illustrates the vias 162, as stopping at the bases of the active surface 112 and second surface 113, that is, the vias do not extend to the upper surface 311 or lower surface 301, the vias 162 may extend through and/or beyond the active surface 112 and/or second surface 113 to facilitate connection to the upper network layer 104 or to the underlying interconnection structures.

Figure 4:
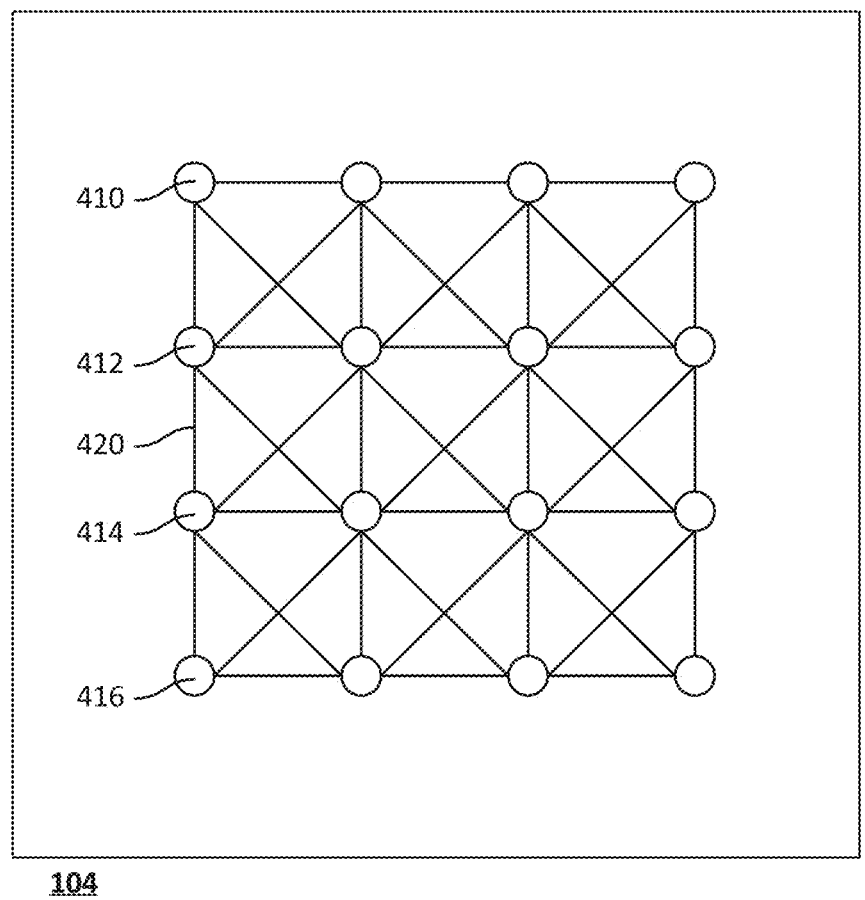
FIG. 4 is a top-down view of a network layer in accordance with aspects of the disclosure.

FIG. 4 shows a top down view of the network layer 104 with the active surface 122 removed for clarity. The network layer 104 includes networking components mounted or otherwise positioned on the network layer 104. The networking components may include routers illustrated as circles, such as routers 410-416, and routing traces illustrated as lines, such as routing trace 420. As discussed herein, the routers 410-416 and routing traces 420 may connect, through electrical interconnections formed by contacts, terminals, and other conductive structures, with memory in the memory layer 106. The routers may also connect with the components in the ASIC layer 102 through the networking interfaces 221A-221C, 231, 261, 271, 281. Although sixteen routers are shown in FIG. 4, any number of routers may be present in the network layer 104. Other components, which may include active or passive components, including capacitance layers, clock structures (e.g., tree or part of tree clock structures) memory, and/or analog circuits may also be included in the network layer 104 as needed.

The network layer 104 may be constructed from one or more semiconductor materials, conductive materials or other materials described herein with regard to the substrate 202. In some instances, more than one network layer 104 may be included on a SoC. By providing additional network layers 104, larger blockages, such as from taller stacks formed from stacking multiple layers, such as device layers and memory layers, may be routed around, which is described herein.

As mentioned herein, the ability to efficiently route a communication subsystem on a device layer, such as an ASIC layer, may be impeded by limitations in space and blockages created by large components, such as a chip die, on the ASIC layer. Such limitations and blockages may potentially lead to inefficient network routings which may in turn reduce the speed of data communication between components and, in some instances, result in processing bottlenecks. In some instances wherein multiple device layers are vertically stacked in a three dimensional (3D) packaging structures, large components in a device layer may constrain the routing options between different components in nearby device layers, such as by projecting into other device layers and/or network layers.

By utilizing additional network layers located above, below, and/or adjacent to the device layers, routing options may be efficiently increased and boosted. The additional network layers may serve as signal relay pathways/bus/checkpoints to re-direct or switch the signal from a first component to a destination second component, either horizontally or vertically, by efficient computational algorithms from the network layers. Each network layer may perform the computational algorithm independently or collectively to determine a most efficient data communication path and/or operations among different components. Thus, more efficient routing of the communication subsystem may be achieved as the routing of the communication subsystem may not be obstructed or otherwise limited by locations or sizes of components on the device layers. As a result, the distance data travels during communication may be reduced and the routing of the data to its destination may be more direct.

FIG. 5 depicts a cut-away side view of a portion of an interconnection structure of a multi-layered SoC 501 having a three-dimensional (3D) packaging structure. The SoC 501 includes a first device layer 502a, a second device layer 502b, a first network layer 504a, a second network layer 504b, and a memory layer 506. The second device layer 502b is positioned between the first network layer 504a and the second network layer 504b. The first device layer 502a and the second device layer 502b may be ASIC layers similar to the ASIC layer 102 described herein. For instance, the first device layer 502a and second device layer 502b may include vias 565a and 565b, respectively. In some examples, the first device layer and/or second device layer 502b can be any other device layer, such as a memory layer, or a network layer. Although only two network layers 504a, 504b, and three device layers 502a, 502b, and 506, are shown in FIG. 5, it is noted that there may be any number of network layers and device layers. For instance, the SoC may include three network layers, three ASIC layers, and a memory layer. In another example, the SoC may include a single ASIC layer and many network and memory layers. In any configuration, the network layers may be configured to connect the device layers together.

The network layers 504a and 504b may be configured to provide electrical interconnection between the network layers and their respective interfacing layers (e.g., device layers 502a and 502b, as well as memory layer 506 in the SoC 501.) For example, active surfaces 542a and 542b of the network layers 504a and 504b may include contacts 515a and 515b, respectively. The second surfaces 541a and 541b of the network layers 504a and 504b may include contacts 544a and 544b, respectively. These contacts, (e.g., contacts 515a, 515b, 544a, and 544b) may align with contacts on adjacent device layers. For example, contacts 544a on the second surface 541a of network layer 504a may connect with contacts 513a on the active surface 511a of ASIC layer 502a. Contacts 544b on the second surface 541b of network layer 504b may connect with contacts 513b on the active surface 511b of ASIC layer 502b. Contacts 515a on the active surface 542a of network layer 504a may connect with contacts 517b on the second surface 545b of ASIC layer 502b. Contacts 517a on the second surface 545a of ASIC layer 502a may connect with other electrical components. In some instances, there may be hundreds of thousands of electrical connections formed between contacts on the network layers 504a, 504b and the device layers 502a, 502b, and 506.

The network layers 504a, 504b may include networking components such as described in with regard to network layer 104. In this regard, network layers 504a, 504b may include routers and other conductive structures configured to connect components within the device layers or otherwise route data between different device layers and network layers. The conductive structures may be the same as those described herein with regard to the ASIC layer 102, such as traces, interconnects, and vias, including vias 564a and 564b shown in FIG. 5. In operation, the network layers 504a, 504b may take packetized data from a component on one device layer and route the data to one or more recipient components on the same or different device layers, where the data is depacketized and delivered to the recipient components.

The memory layer 506 may be similar to memory layer 106 described herein. As shown in FIG. 5, memory layer 506 is disposed on the second network layer 504b. Contacts 555 on the active surface 556 of the memory layer 506 may be arranged such that they align, and in some instances connect with, contacts 515b on the active surface 542b of the network layer. There may be millions of electrical connections formed by the contacts on the network layer 504b and the memory layer 506.

Figure 6:
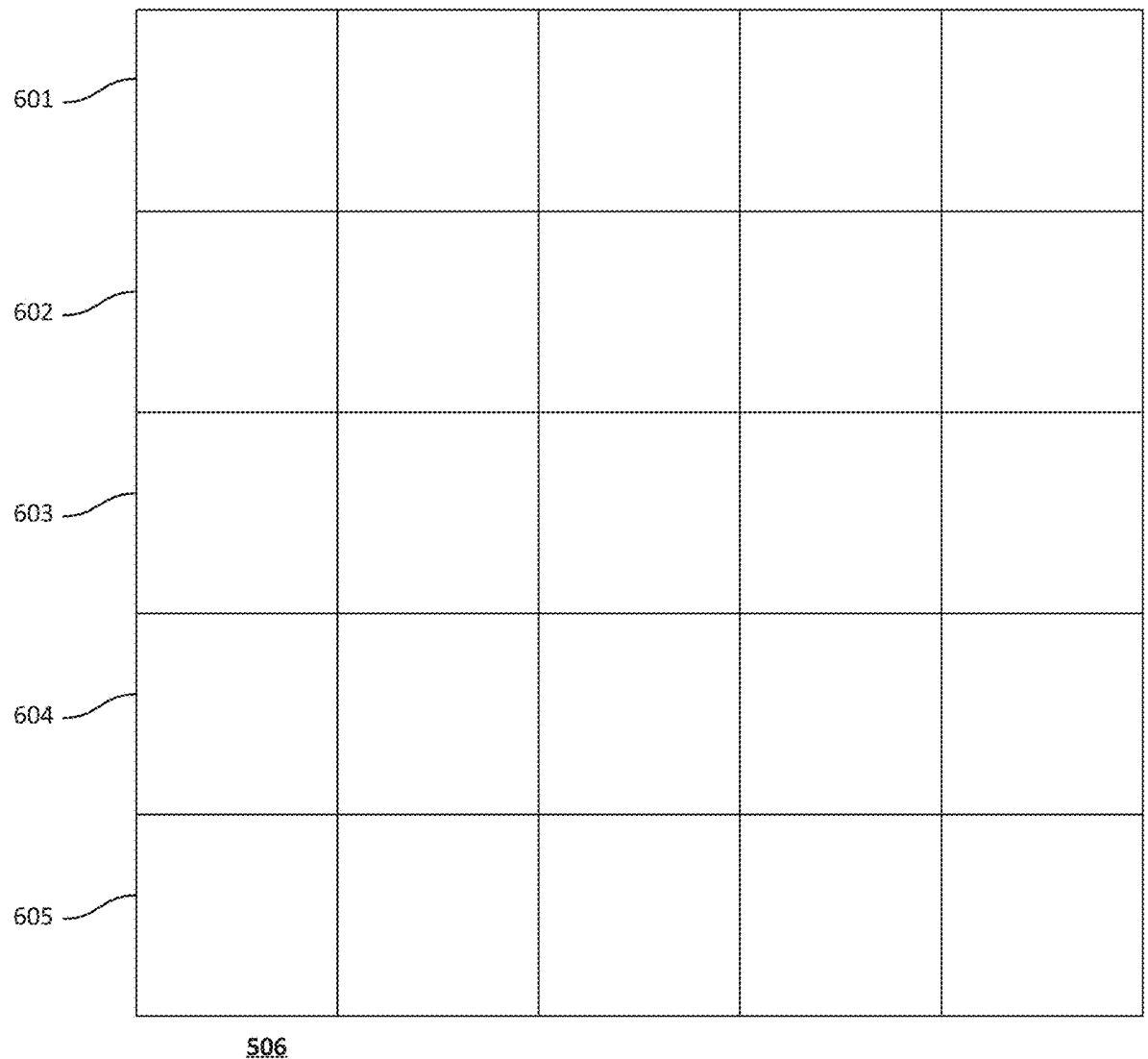
FIG. 6 is a top-down view of a memory layer in accordance with aspects of the disclosure.

The memory layers, such as memory layers 106 and 506, may include one or more memory segments. For instance, and as shown in FIG. 6, memory layer 506 includes 25 memory segments, including memory segments 601-605, although any number of memory segments may be possible. The memory segments may be NAND memory or other such volatile and non-volatile memory including MRAM, NRAM, FE-RAM, etc.

Production of the memory segments may include creating a memory wafer and cutting the memory wafer into memory segments of a chosen size. In this regard, each memory wafer may have the same design to allow for reusability of the memory segments by different SoC designs. For instance, the memory wafer may be created in set increments, such as 1×1 mm, 2×2 mm, 4×4 mm, etc. The memory wafer may then be cut or otherwise separated into memory segments sized for the SoC they are being used. For example, the die size of SoC 101, that is the size of the ASIC layer 102, may be 10×10 mm. To form memory layer 106, four memory wafers having a size of 5×5 mm may be cut into 1×1 mm segments, resulting in 100 1×1 mm memory segments being formed. The 100 memory segments may then be arranged in the memory layer 106 such that the memory layer 106 has the same size as the die (10×10 mm). Although the memory segments are described as being 1×1 mm in the foregoing example, the memory segments may be any size. For instance, a 20×20 mm die may have a corresponding memory layer made up of a 10×10 array of 2×2 mm memory segments or a 10×20 mm die may have a corresponding memory layer including a 5×10 array of 2×2 mm memory segments. In some instances, multiple memory segments may be formed on the same wafer. For instance, a 10×10 mm memory array may be made up of a 10×10 mm memory wafer having two 5×10 mm memory segments. In other words, memory segments may be formed directly on a wafer, as opposed to by cutting the wafer.

The size of the memory layers, such as memory layers 106 and 506, may be the same or different than the other device layers, such as ASIC layers and network layers. In some instances, the dimensions of the memory layer, such as its width and length may match a multiple of the memory dimensions so that the interconnection of the memory layer coincides with the other device layers. In another embodiment, a die-to-wafer assembly may be used. In this embodiment the memory layer may not be matched to the device layers, such as the ASIC layer or network layer, but the network layer may match the memory layer or ASIC layer.

The layers of the SoCs described herein, such as SoC 101 and 501 may be bonded in a stacked arrangement using various bonding techniques, including using direct dielectric bonding, non-adhesive techniques, such as a ZiBond® direct bonding technique, or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety). Referring to FIG. 5, these bonding techniques may enable the contacts on of the device layers to bond to contacts in the network layers. For instance, contacts 513a on the active surface 511a of the first device/ASIC layer 502a may be bonded to the contacts 544a in the second surface 541a of the first network layer 504a. Similarly, this process may enable the contacts 515a on the active surface 542a of the first network layer 504a to bond to the contacts 517b on the active surface 545b of the second device layer 502b. The contacts 555 on the active surface 556 of the memory layer 506 may bond to the contacts 515b on the active surface 542b of the network layer using the same bonding techniques. The contacts may have an extremely fine pitch. For example, the contacts may be at a pitch as low as approximately 1μ-10μ, or in some instances, as low as around 100 mm or greater that 10μ.

In the embodiment depicted in FIG. 5, the device layers 502a, 502b, and 506 are each connected to at least one of network layers 504a and 504b to produce data communication paths between the layers. For instance, ASIC layer 502a is connected to the memory layer 506 via the various connections between network layers 504a and 504b, as well as ASIC device 502b.

As described, components may be formed on the device layers. For instance, ASIC layer 502a includes components 512, 514, and 516 and ASIC layer 502b includes components 522, 524, and 526, as shown in FIG. 5. It is noted that the components shown in FIG. 5 may be the same or similar to the components 220A-220C, 230, 260, 270, 280 depicted in FIG. 2. The components of memory layer 506, including components 532, 534, and 536 may include components such as NAND memory or other such volatile and non-volatile memory including MRAM, NRAM, FE-RAM, etc. Alternatively, the components 512, 514, 516, 522, 524, 526, 532, 534, and 536 may be any suitable electrical components designated to perform certain functions as needed. Although only three components are shown in each active surface of ASIC layers 502a and 502b, as well as in active surface 556 of memory layer 506, it is noted that each device layer may have any number of components and that the components may be placed at any position and/or on any surface.

Figure 7:
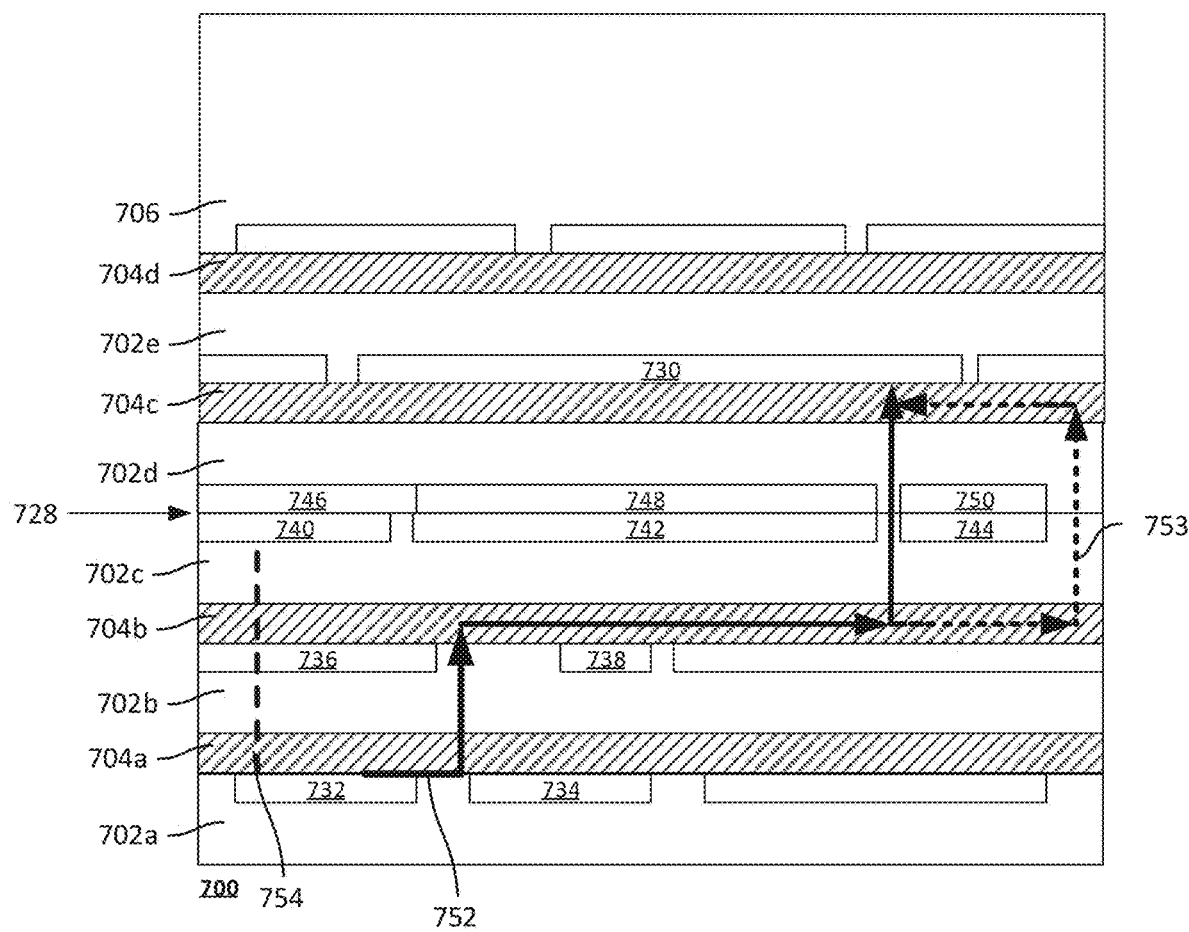
FIG. 7 is a cross-section, side view of data communication paths through multiple device layers and multiple network layers in accordance with aspects of the disclosure.

FIG. 7 depicts another embodiment of a stacked SoC 700 including six device layers 702a, 702b, 702c, 702d, 702e, and 706 and four network layers 704a, 704b, 704c, and 704d. The device layer 706 may be similar to the memory layers 106 and 506, and device layers 702a-e may be similar to ASIC layers 102, 502a, and 502b. The network layers 704a-d may be compared with network layers 104, 504a, and 504b, and may facilitate communication of data between the device layers. Each of the network layers is positioned between a respective pair of device layers. For example, and as further shown in FIG. 7, network layer 704a is positioned between device layers 702a and 702b, network layer 704b is positioned between device layers 702b and 702c, network layer 704c is positioned between device layers 702d and 702e, and network layer 704d is positioned between device layers 702e and 706. It is noted that the conductive structures, such as contacts, terminals, vias, etc., are not shown for clarity. Similarly, or active and secondary surfaces formed in the network layers and the device layers are not shown in FIG. 7 for clarity and ease of description.

In some instances, device layers may be bonded face to face without a network layer positioned there between. In this regard and as further shown in FIG. 7 a direct bonding process (e.g., a face-to-face) is utilized between the device layers 702c and 702d at bonding interface 728, thereby eliminating the need for a network layer between the device layers. In this regard, communication between device layers 702c and 702d may be made between connections at bonding interface 728.

Device layers 702a-702e and 706 may include components. For example, device layer 702a includes components 732 and 734, device layer 702b includes components 736 and 738, device layer 702c includes components 740, 742, and 744, device layer 702d includes components 746, 748, and 750, and device layer 702e includes component 730. For clarity, not all components are illustrated. The components shown in FIG. 7 may be the same or similar to the components 220A-220C, 230, 260, 270, 280 depicted in FIG. 2 and components 532, 534, and 536 depicted in FIG. 5.

As further shown in FIG. 7, the positioning of components within the device layers may constrain communication routing options between components and/or different layers. For example, a direct communication path, such as shown by dotted line 754, between component 732 in device layer 702a and component 730 in device layer 702e may be blocked by component 736 in device layer 702b.

By utilizing multiple network layers, efficient communication routes may be used to circumvent the blockages created by the components. In this regard, the network layers may serve as electrical communication pathways capable of determining and providing efficient communication pathways among components that may be positioned vertically and/or horizontally apart. Each network layer may be programmed with a computational algorithm or other such logic for determining the most efficient communication paths among the components vertically or horizontally located at the different device layers. Each network layers 704a-704d may perform the computational algorithm or logic independently to determine a most efficient data communication pathway and/or operation among between different components. For example, when an electrical communication is requested between component 732 in device layer and component 730 in device layer 702e, an efficient communication route, illustrated by solid line 752, may be determined by the network layers 704a, 704b, and 704c. In this regard, network layer 704a may determine the most efficient path to route the data from component 732 in device layer 702a to network layer 704b is between components 736 and 738. Network layer 704b may then determine the most efficient path to network layer 704c is between components 742 and 744 in device layer 702c and components 748 and 750 in device layer 702d, as opposed to travelling around components 744 and 750, as shown by dashed lines 753. Network layer 704c may then pass the data to component 730 in device layer 702e. In some examples, the network layers may perform the computational algorithm or logic collectively as needed.

In one example, the network layers may include at least one look-up table (LUT) or other such storage area, capable of providing a look-up mechanism. The look-up mechanism may utilize information from the look-up table to store, retrieve and direct data among the multiple network layers or device layers nearby. The look up table may be a circuit which can be programmed to produce an output signal in response to an input signal so as to perform a logical function. It is noted that the functions, logic or the programs in the network layers may be design dependent so that each network layer may meet different electrical performance and requirements as needed.

Furthermore, the network layers may also be programmed to provide information regarding the layout, such as the physical locations, of the components formed in each device layer, network layer, and/or memory layer. Such information may assist the network layers to make routing decisions more efficiently and accurately. Accordingly, the physical and relative locations of the components, such as large functional blocks located in a device layer or memory layer may be known by the network layers for efficient routing and electrical communication routing decisions. The layouts and relatively physical relationship of the components blocks may be instantiated as a library exchange format (LEF) and/or design exchange format (DEF) as needed for fabrication.

In some instances, the network layers may have a master/slave relationship. In this regard, one or more network layers may be master layers capable of making and providing routing decisions on behalf of other network layers, referred to as slave network layers.

Utilization of the multiple network layers, such as network layers 704a-d, may reduce the impact of the large blockages created by components, by routing data around the blockages in an efficient manner. As a result, a more flexible electric communication subsystem and wiring options may be obtained, providing adjustable or programmable electrical communication paths among the components with minimum impact from the potential blockage created from the components in the device layers.

Figure 8A:
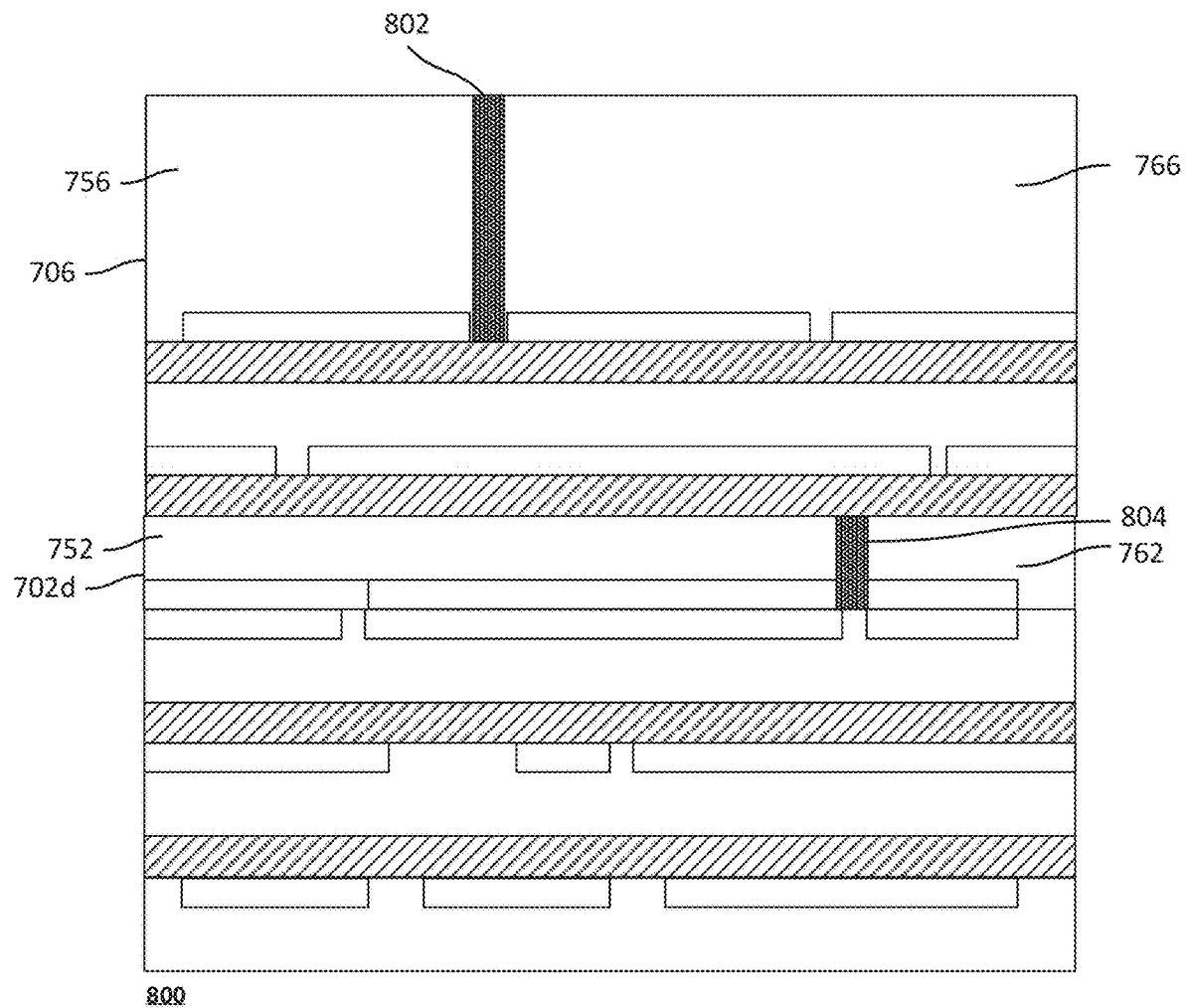
FIGS. 8A and 8B depict cross-section, side views of the interconnections of device layers and network layers with fillers disposed therein in accordance with aspects of the disclosure.

FIG. 8A depicts another example of a stacked SoC 800, similar to the interconnection 700 depicted in FIG. 7, but with fillers 802, 804 disposed in device layers 706 and 702d. Fillers may be utilized when a die-to-wafer bonding technology is utilized. For example, when a die, rather than an entire wafer, substrate, or device layer, is selected to individually bond to a specific component in a device layer, a total area of the die may be less than to an area of the device layer where the die is bonded to. Thus, vacant gaps, grooves or spaces may be filled among the adjacent bonded dies with fillers, such as insulating materials.

Figure 8B:
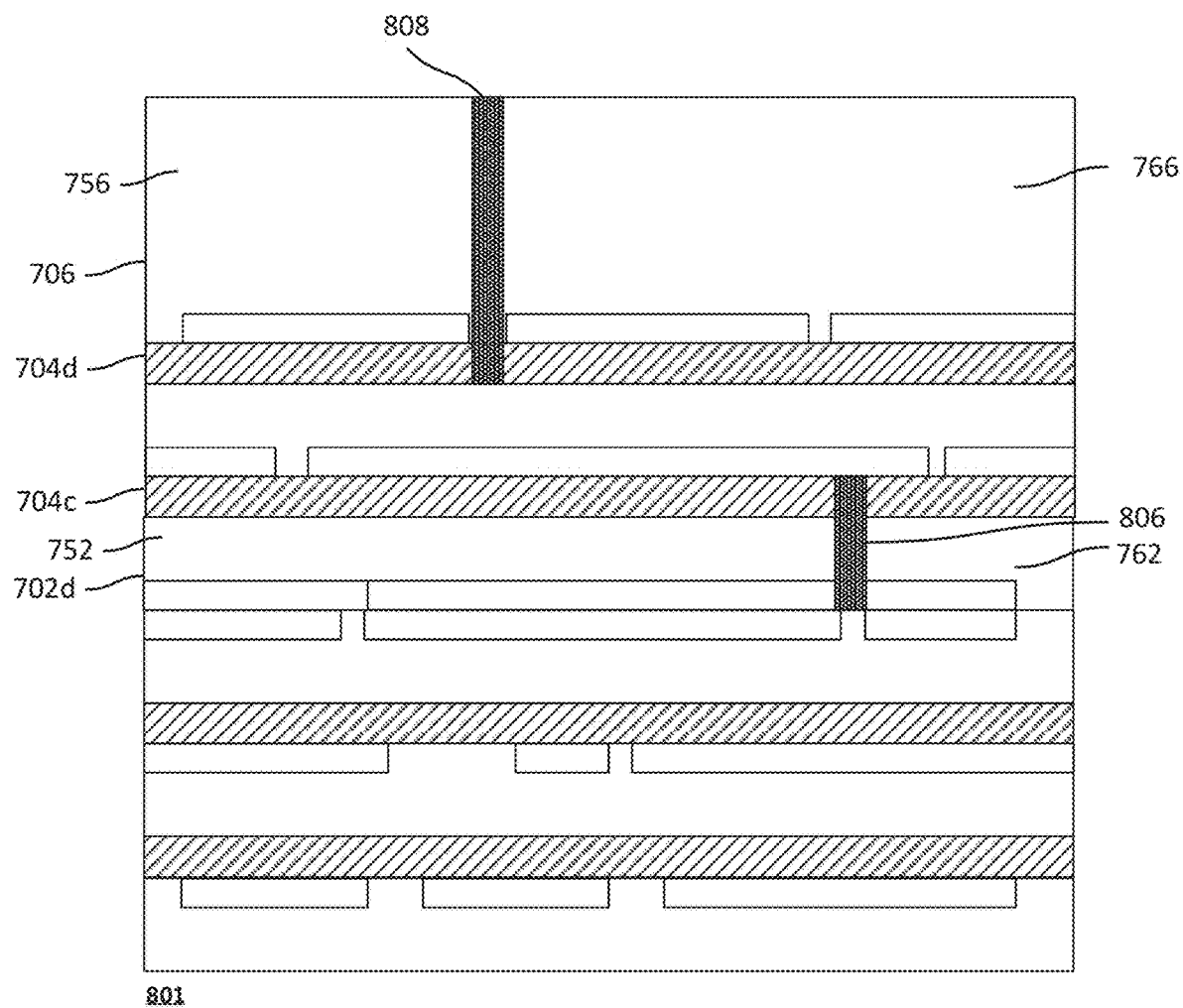

For example, and as shown in FIG. 8A, filler 802 separates dies 756 and 766 in device layer 706 and filler 804 separates dies 725 and 762 in device layer 702d. In the embodiment depicted in FIG. 8, the fillers 802, 804 may be disposed among the bonded dies (e.g., 756 and 776, and 752 and 762) without blocking the ability of the network layers, such as 704c and 704d.

In some examples, fillers may be extended into the network layers thereby creating separate networks on a single network layer. For example, and as shown in stacked SoC 801 in FIG. 8B, filler 806 extends from device layer 702d into network layer 704c, thereby splitting network layer 704c into two parts. Similarly, filler 808 extends from device layer 706 through network layer 704d, thereby splitting network layer 704d into two discrete networks.

Figure 9A:
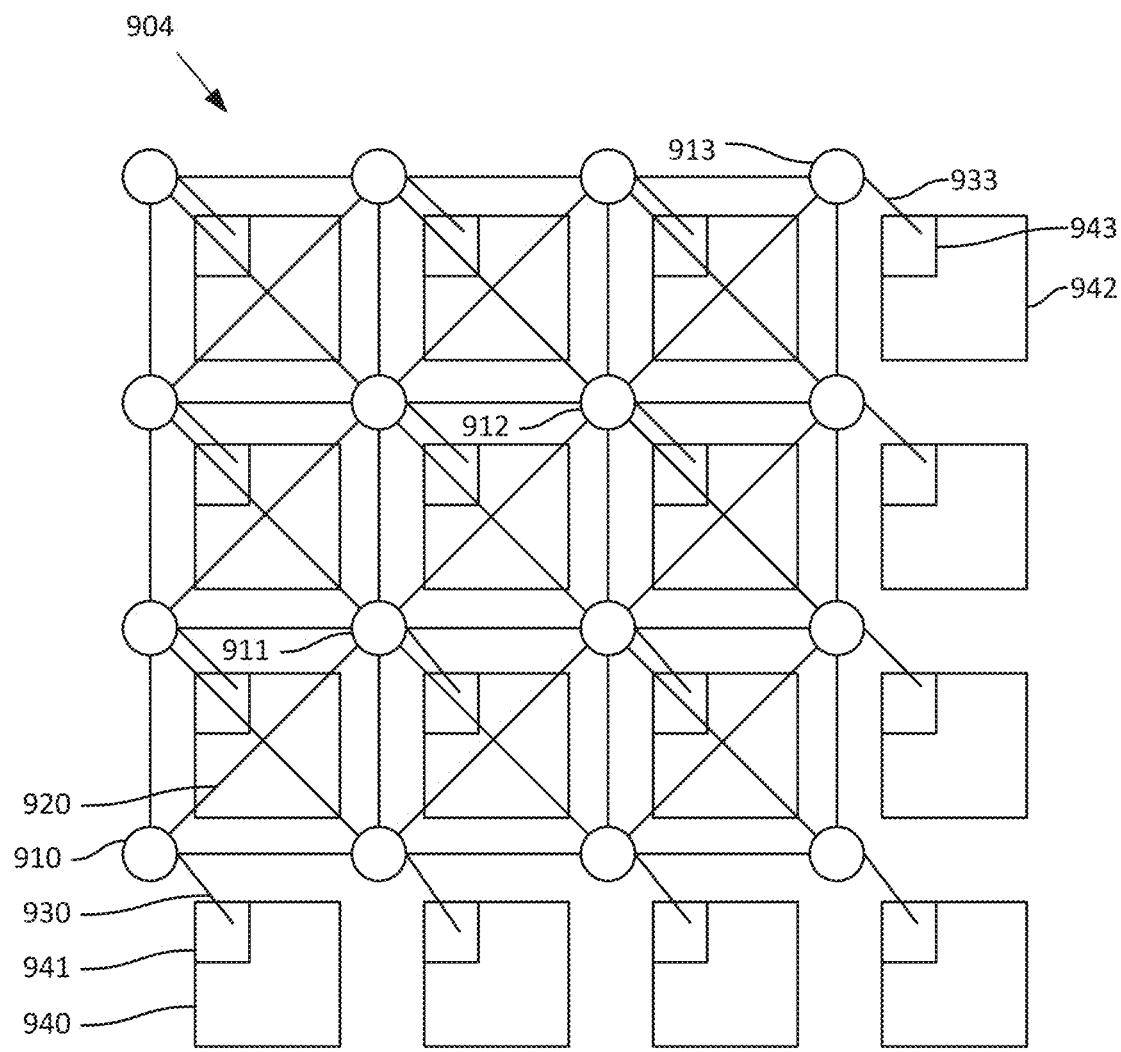
FIG. 9A is a top-down view of components of a network layer and a device layer in accordance with aspects of the disclosure.

FIG. 9A shows the interconnection of components of a network layer 904 with components of an ASIC layer. In this regard, routers 910-913 are connected via routing traces 920 on the network layer 904. Although FIG. 9A illustrates the components of the network being configured in a mesh topology, the network may be configured in any topology such as a ring topology, start topology, etc.

The ASIC layer includes a plurality of processors, including processors 940 and 942 that include network interfaces 941 and 943, respectively. The components of the ASIC layer are connected to the network layer via conductive structures, including conductive structures 930 and 933 that connect network interfaces 941 and 943 to router 910 and 913, respectively. Although FIG. 9A illustrates the conductive structures as single lines, the conductive structures may include any combination of terminals, contacts, vias, conductive interconnects, etc. as described herein. Moreover, although FIG. 9A shows only processors in the ASIC layer, other components such as GPUs, DSPs, etc. may be present in the ASIC layer.

Figure 9B:
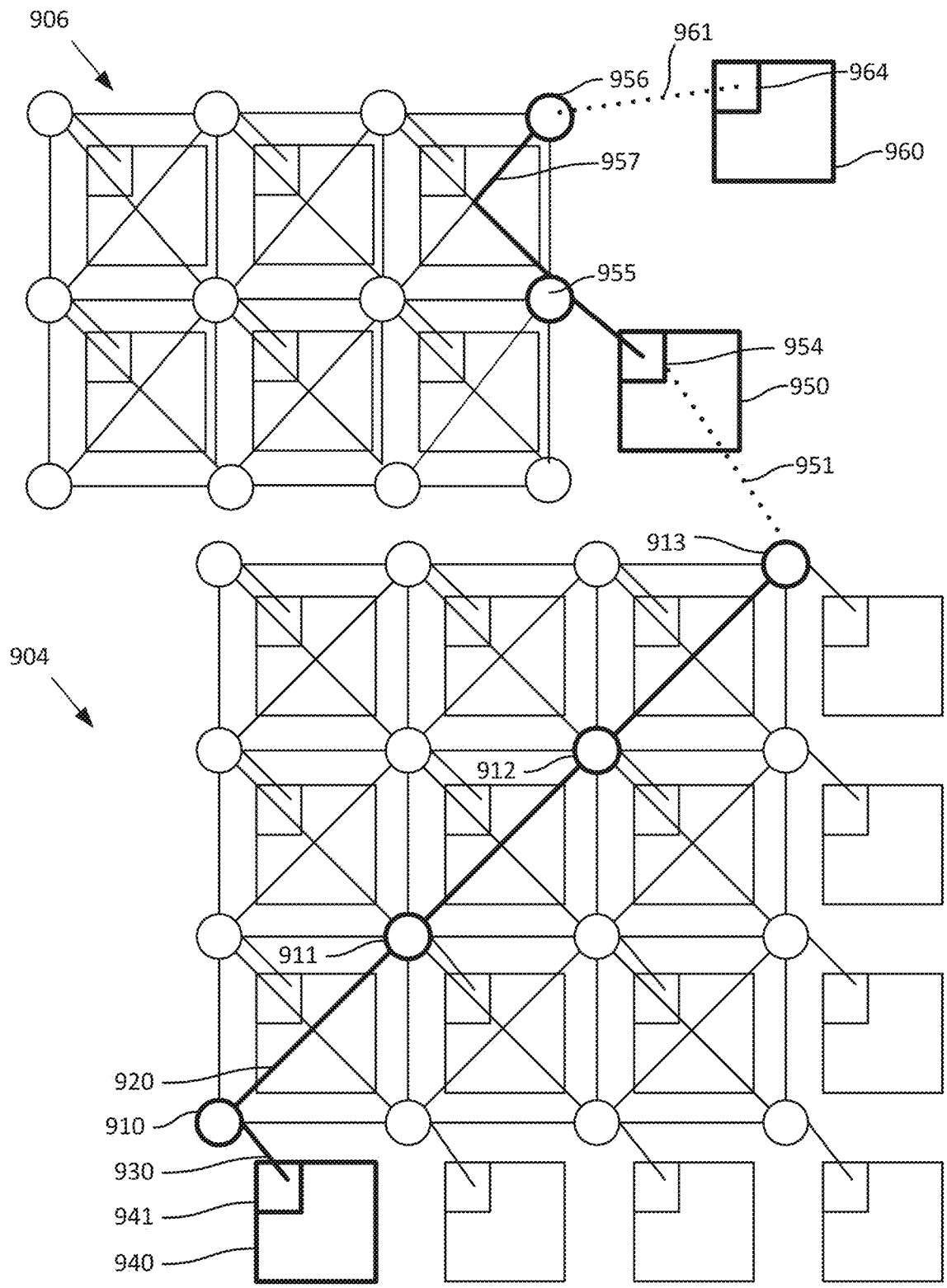
FIG. 9B is a top-down view of data communication path through multiple network layers among different device layers in accordance with aspects of the disclosure.

FIG. 9B shows a portion of an interconnection having more than one network layer, including network layers 904 and network layer 906, connecting components from more than one ASIC layer. Similar to the configuration described in FIG. 9A, routers 910-913 from the first network layer 904 are connected via routing traces 920. Routers 955 and 956 from the second network layer 906 are connected via routing traces 957. Data may be sent from processor 940 in the first ASIC layer to processor 960 in a third ASIC layer via network layers 904 and 906, as well as an intermediary ASIC layer as illustrated by the bolded lines. In this regard, data may be sent from processor 940 to network layer 904 via network interface 940 and conductive structure 930. The data may travel through routers 910-913 via routing traces 920. Router 913 may then direct the data to processor 950 via conductive trace 951. Processor 950 may pass the data to network layer 906 via network interface 954. The data may then travel from router 955 to router 956, via routing traces 957. Router 956 may then pass the data to network interface 964 of processor 960 via conductive structure 961.

Figure 10A:
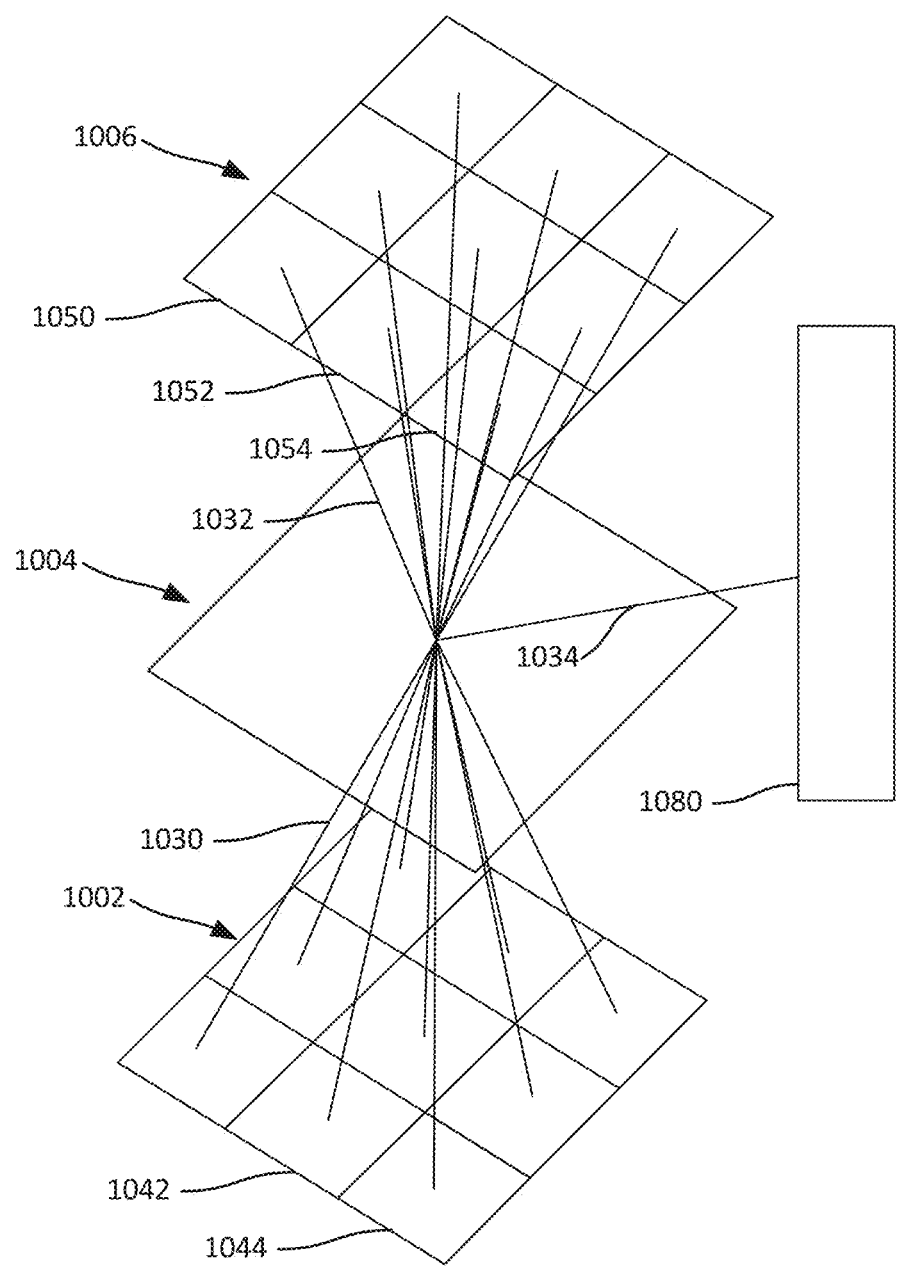
FIG. 10A shows the interconnection of device layers and network layers in accordance with aspects of the disclosure.
Figure 10B:
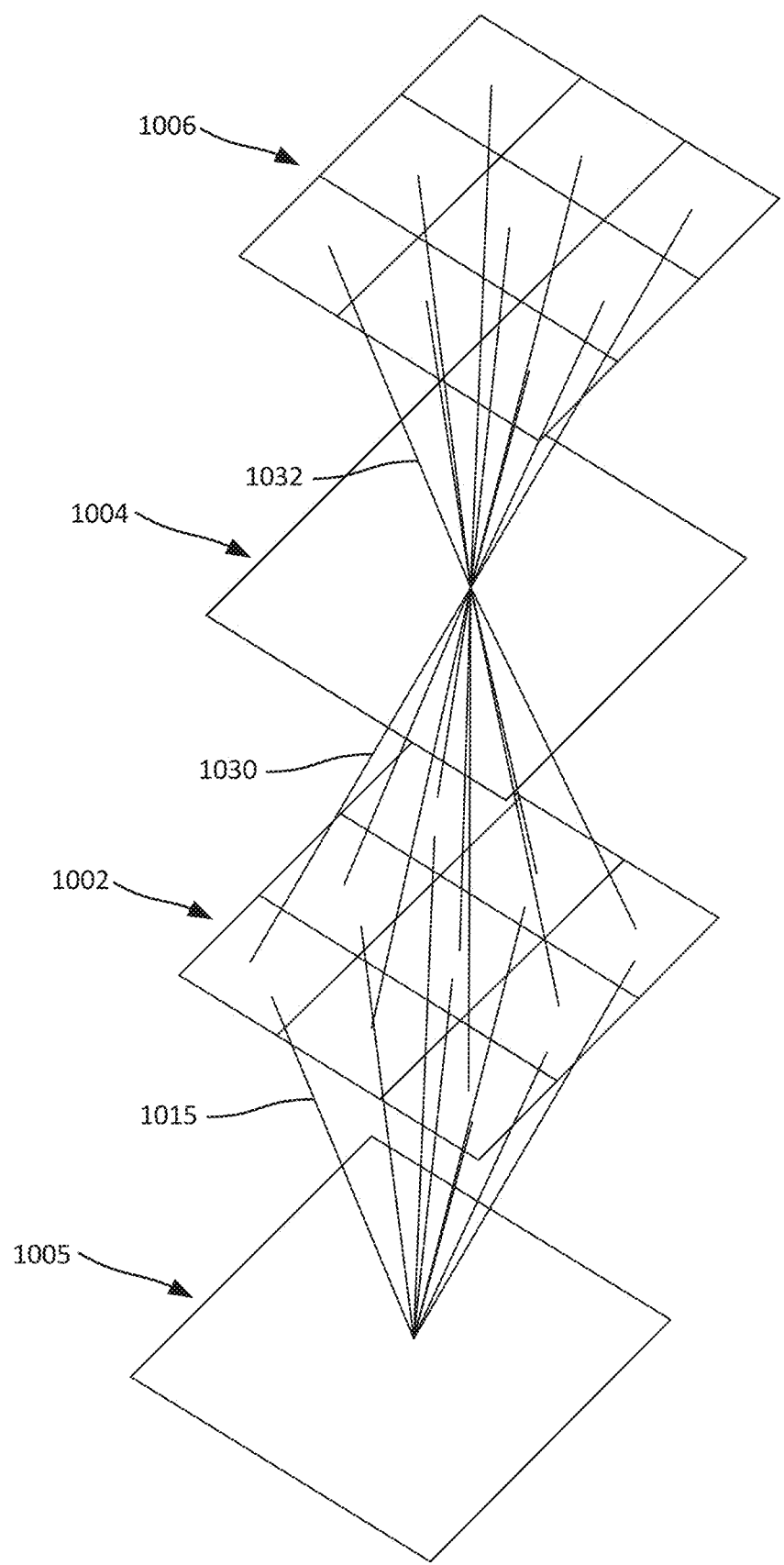
FIG. 10B shows the interconnection of device layers and network layers in accordance with aspects of the disclosure.

It is noted that the numbers of the components in the ASIC layers and the network layers depicted in FIG. 10B is only for illustration purposes. Any numbers of the components in the ASIC layers and the network layers may be utilized as needed.

FIG. 10A shows the interconnection of ASIC layer 1002 (similar to the ASIC layer 102 depicted in FIG. 1) with memory layer 1006 (similar to the memory layer 106 depicted in FIG. 1) through the network layer 1004 (similar to the network layer 104 depicted in FIG. 1). In this regard, processors or other components on the ASIC layer, including processors 1042 and 1044 are connected via conductive structures 1030 to the network layer 1004. The network components on the network layer 1004 are connected to memory segments, such as memory segments 1050-1054 in the memory layer 1006 via conductive structures 1032. For clarity, networking components, including routers and routing traces are not shown in the network layer 1004. It should be understood that each component in the ASIC layer 1002 connects to one or more routers in the network layer 1104. For clarity, only a subset of the components on the ASIC layer and memory segment on the memory layer are labeled in FIG. 10A.

To read and write data to memory segments in the memory layer 1006, a processor such as processor 1042, or another component in the ASIC layer 1002, may pass data and/or instructions to the network layer 1004 via conductive structures 1030. The data may be packetized by network interfaces prior to being transmitted to the network layer. The routers may direct the data and/or instructions to the appropriate memory segments, such as memory segment 1050, on the memory layer 1006. The data may be depacketized after reaching memory segment 1050. Given the proximity of the memory layer 1006 to the components in the ASIC layer 1002, the memory segments, such as memory segments 1050-1052 in the memory layer may effectively operate as L2 cache memory.

In some instances the routers may direct data and/or instructions to memory located off of the SoC package. For example, and as further illustrated in FIG. 10A L3 memory 1080 may be connected to the network layer 1004 via one or more conductive structures, such as conductive structure 1034. In operation, a processor or other component of the ASIC layer 1002 may pass instructions and/or data to the network layer 1004. The data and/or instructions may be routed through the network layer via one or more routers to conductive structure 1034. The data and/or instructions are passed through the conductive structure 1034 to the L3 memory 1080. The routers may direct data and/or instructions to other devices, such as other processors, located off the SoC package via one or more conductive structures. Additional network layers may be further formed on the memory layer 1006 and similarly constructed to facilitate further vertical communications in the device layers formed in the SoC. In some instances, the network layer may be configured to disregard faulty or otherwise nonfunctional memory segments as needed.

FIG. 10B illustrates an interconnection having two network layers 1004 and 1005. In this regard, data from a first device layer (not shown) may be transmitted to memory layer 1006. Network layer 1005, positioned between the first device layer and ASIC layer 1002, may receive the data and forward it to ASIC layer 1002 via conductive structures 1015. The data may then be passed to network layer 1004 via conductive structures 1030, which in turn may direct the data to memory layer 1006 via conductive structures 1032.

Figure 11:
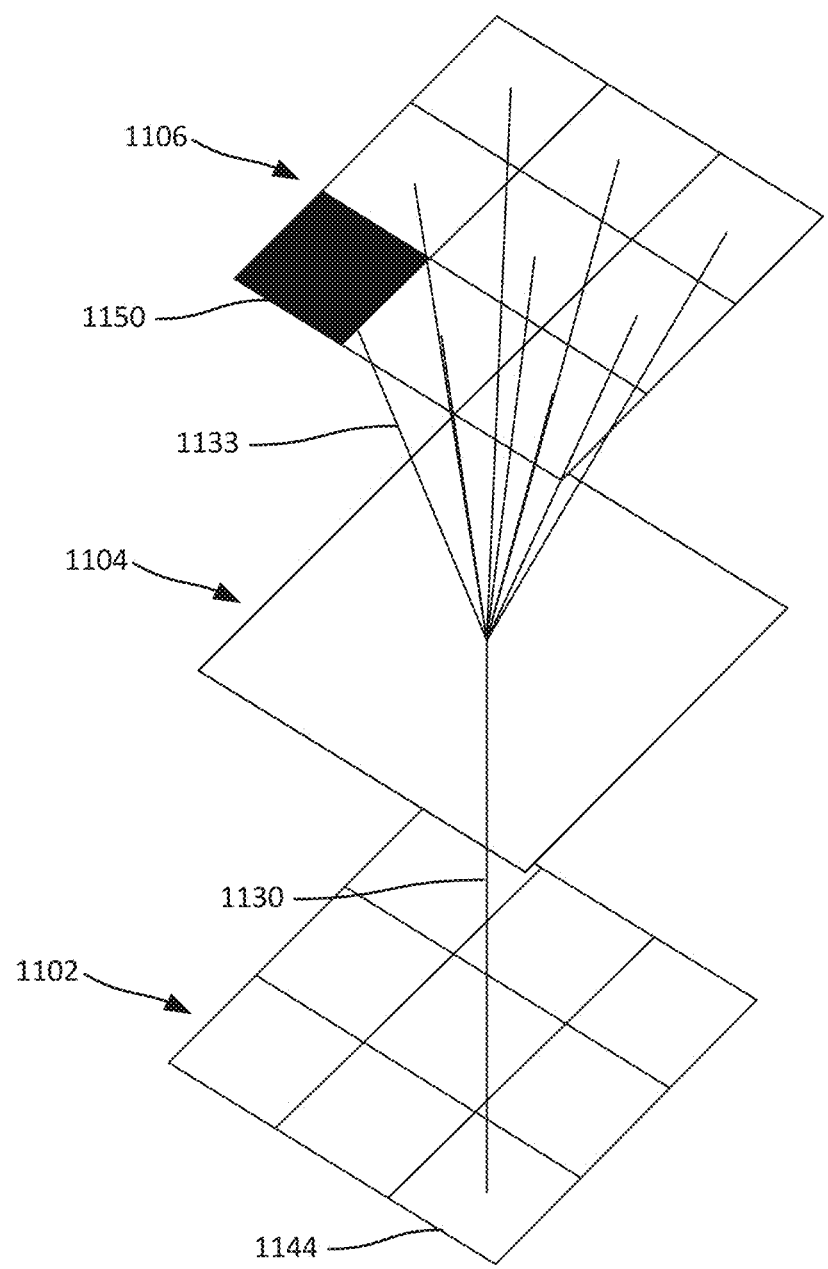
FIG. 11 is a perspective view of device layers and a memory layer with a defective memory segment in accordance with aspects of the disclosure.

In some instances, the network layer may be configured to disregard faulty or otherwise nonfunctional memory segments. For example, and as illustrated in FIG. 11, memory segment 1150 on memory layer 1106 may be faulty. As a result, network layer 1104 may ignore memory segment 1150 by not routing any data to that memory segment via conductive structure 1133. Faulty memory segments may be determined by performing known memory testing during production of the SoC or memory, such that an e-fuse can set bad sectors. In some instances, faulty memory segments may be detected during operation (down cycles) or during boot-up of the SoC. In this regard, a basic MBIST (Memory Built-in Self-Test) can evaluate the sectors in each memory segment to determine which segments or sectors in the segment are fully operational and which ones are not. Conversely the same approach may apply to a multi-processor approach where the network layer can ignore and route around faulty processors or processing elements arranged on the ASIC layer or other layer.

Although the layers described above are identified as having distinct components and features, such as a memory layer having memory, a network layer having networking components, and an ASIC layer including computing components, each layer may include components associated with another layer. For instance, memory layers may include networking components and/or computing components, network layers may include memory and/or computing components, and ASIC layers may include networking components and/or memory.

The invention claimed is:

1. A system on chip (SoC) comprising:
a plurality of network layers including a first network layer and a second network layer, each network layer including one or more routers; and
a first device layer including one or more components, the first device layer having an active surface and a second opposite surface, the active surface being bonded to the second network layer and the second opposite surface being bonded to the first network layer,
wherein at least a first component and a second component of the one or more components each include a network interface, wherein the network interface of the first component and the network interface of the second component connect the first and second components to the first network layer and the second network layer via conductive structures, and
wherein the first network layer and the second network layer are configured to route data from the first component to the second component.

2. The system of claim 1, wherein the first network layer and the second network layer are configured to route data to and from the one or more components on the first device layer.

3. The system of claim 1, wherein the first network layer is configured to control operation of the second network layer.

4. The system of claim 1, wherein the first network layer and the second network layer are configured to operate independently.

5. The system of claim 1, wherein the conductive structures comprise one or more of traces, vias, contacts, or terminals.

6. The system of claim 1, wherein the network interface of the first component and the network interface of the second component are configured to packetize and depacketize data.

7. The system of claim 1, wherein the first device layer comprises at least one of an application specific integrated circuit (ASIC) layer or a memory layer.

8. The system of claim 1, wherein the plurality of network layers each comprise an active surface having one or more contacts; and
a second surface opposite the active surface having one or more contacts.

9. The system of claim 8, wherein the second surface of the second network layer is bonded to the active surface of the first device layer and the active surface of the first network layer is bonded to the second surface of the first device layer.

10. The system of claim 9, further including a memory layer including an active surface having one or more contacts, the active surface of memory layer being bonded to the active surface of the second network layer.

11. The system of claim 10, wherein the memory layer includes one or more memory segments, each of the one or more memory segments being connected to at least one of the one or more routers in the second network layer via one or more conductive structures.

12. The system of claim 11, wherein the second network layer is configured to route data between the one or more components in the first device layer and the one or more memory segments.

13. The system of claim 10, wherein the bonds between the first device layer and first and second network layers, and the bonds between the memory layer and the second network layer are formed via ZiBond direct bonding and/or direct bond interconnect (DBI) hybrid bonding.

14. The system of claim 9, further including a second device layer including one or more components, the second device layer having an active surface and a second opposite surface, the second opposite surface being bonded to the active surface of the second network layer.

15. The system of claim 14, including a third device layer including one or more components, the third device layer having an active surface and a second opposite surface, the active surface being bonded to the second surface of the first network layer.

16. The system of claim 14, wherein the first and second network layers are configured to route data between the one or more components on the third device layer and the one or more components in the second device layer.

17. The system of claim 16, wherein the bonds between the first device layer and first and second network layers, the bonds between the second device layer and the second network layer, and the bonds between the third device layer and the first network layer are formed via ZiBond direct bonding and/or direct bond interconnect (DBI) hybrid bonding.

18. The system of claim 14, wherein the first and second network layers are configured to ignore faulty memory segments or faulty processors.

19. The system of claim 1, wherein the one or more components include one or more of processors, graphics processing units (GPUs), logic boards, digital sound processors (DSP), or network adaptors.

20. The system of claim 1, wherein the one or more routers of the first and second network layer are connected via one or more routing traces in each respective network layer.

21. The system of claim 1, wherein the first and second network layers are connected to memory located outside of the SoC.

* * * * *